(12) United States Patent
Lee et al.

(10) Patent No.: US 7,365,572 B2
(45) Date of Patent: Apr. 29, 2008

(54) MULTIPATH INPUT BUFFER CIRCUITS

(75) Inventors: Jae-goo Lee, Gyeonggi-do (KR);
Im-soo Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 121 days.

(21) Appl. No.: 11/250,117

(22) Filed: Oct. 13, 2005

(65) Prior Publication Data

US 2006/0132181 A1 Jun. 22, 2006

(30) Foreign Application Priority Data

Dec. 22, 2004 (KR) .................. 10-2004-0110176

(51) Int. Cl.
*H03K 19/0175* (2006.01)
(52) U.S. Cl. .................. 326/83; 326/82; 326/86; 327/530
(58) Field of Classification Search .................. 326/83, 326/80, 62
See application file for complete search history.

(56) References Cited

U.S. PATENT DOCUMENTS 5,903,168 A * 5/1999 Yang et al. .................. 326/86

| 6,753,720 B2 * | 6/2004 | Kono et al. .................. 327/538 |
| 2002/0011883 A1 * | 1/2002 | Yamazaki et al. .......... 327/143 |
| 2003/0214345 A1 * | 11/2003 | Yamauchi et al. .......... 327/530 |

FOREIGN PATENT DOCUMENTS

KR 100298433 B1 5/2001

\* cited by examiner

*Primary Examiner*—Vibol Tan
(74) *Attorney, Agent, or Firm*—Myers Bigel Sibley & Sajovec

(57) ABSTRACT

Provided is a multi-path input buffer circuit, which passes a signal input to a semiconductor device through different paths in consideration of the voltage level of the input signal. The multi-path input buffer circuit includes an input buffer stage, which can be driven using one of at least two power supply voltages, outputs path signals by passing an input signal through at least two paths, selects and enables one of the path signals in response to a plurality of path selection signals, and maintains the rest of the path signals in a high impedance state. The buffer circuit also includes a level shifter, which shifts the voltage level of a signal output from the input buffer stage via the first path, and a first logic operation circuit, which operates in response to the output signal of the input buffer stage and a signal output from the level shifter.

13 Claims, 4 Drawing Sheets

MULTIPATH INPUT BUFFER CIRCUITS

REFERENCE TO PRIORITY APPLICATION

This application claims the benefit of Korean Patent Application No. 2004-110176, filed on Dec. 22, 2004, the disclosure of which is hereby incorporated herein by reference.

FIELD OF THE INVENTION

The present invention relates to integrated circuit devices and, more particularly, to integrated circuit devices that buffer digital signals having different voltage swing widths.

BACKGROUND OF THE INVENTION

Logic operation circuits having the same logic operation characteristics typically consume more power at higher supply voltage levels than at lower supply voltage levels. If a signal having a high voltage level is input to a logic operation circuit and the logic operation circuit is driven at such a high voltage level, the logic operation circuit may consume more power than if it is driven at a lower voltage level. In order to solve this problem, an input buffer circuit may be used to lower the voltage level of the signal input to the logic operation circuit so that the logic operation circuit is driven at a voltage level lower than the voltage level of the signal input thereto.

A semiconductor device may be driven using one or two voltage sources. In a case where there is the need to supply various levels of voltages, to the semiconductor device, a voltage regulator may be used to generate the various levels of voltages. Thus, a manufacturer of the semiconductor device may manufacture the semiconductor device in consideration of the highest one of the voltages provided by the voltage sources.

FIG. 1 is a circuit diagram of a conventional input buffer circuit 100. Referring to FIG. 1, the conventional input buffer circuit 100 includes a buffering block 120, a level shifter 130, and a buffer 140. The buffering block 120 includes a NAND gate 121, which receives a signal input to a semiconductor device via a pad 110 with one of its input ports, and a first inverter 123, which inverts a signal output from the NAND gate 121. A low power mode signal STD is input to the other input port of the NAND gate 121. The low power mode signal STD is not enabled when the semiconductor device normally operates but is enabled when the semiconductor device stops operating. When the low power mode signal STD is enabled, the buffering block 120 outputs a uniform level of direct current (DC) voltage. Here, it is assumed that the input signal swings between a first power supply voltage VDD3 and a ground voltage or between the first power supply voltage VDD3 and a voltage lower than the ground voltage. In FIG. 1, MV indicates that an element operates at a high voltage level.

The level shifter 130 receives the input signal from the buffering block 120 and lowers the voltage level of the input signal in consideration of a second power supply voltage VDD that drives a logic circuit 150 of the semiconductor device. The buffer 140 enhances the driving capability of a signal output from the level shifter 130. The same level of power supply voltage is applied to the buffer 140 and to the logic circuit.

The logic circuit 150 is driven using the second power supply voltage VDD, which is lower than the first power supply voltage VDD3, in order to reduce the power consumption of the semiconductor device. A manufacturer of the semiconductor device applies the first power supply voltage VDD3 to the semiconductor device and generates the second power supply voltage VDD, which is lower than the first power supply voltage VDD3, in the semiconductor device using a voltage regulator.

The conventional input buffer circuit 100 is designed in consideration of the assumption that the input signal swings within a predetermined range of the first power supply voltage VDD3. However, the level shifter 130 should be used even when the input signal swings within a range of the second power supply voltage VDD.

SUMMARY OF THE INVENTION

The present invention provides a multi-path input buffer circuit, which performs a buffering operation on a signal input to a semiconductor device by passing the input signal through one of a plurality of paths in consideration of the voltage level of the input signal. According to an embodiment of the present invention, there is provided a multi-path input buffer circuit which is used in hardware designed to be able to selectively use one of at least two power supply voltages, converts an input signal to be compatible with one of the power supply voltages selected by a user, and outputs the converted input signal. The multi-path input buffer circuit includes an input buffer stage, which can be driven using one of at least two power supply voltages, outputs path signals by passing an input signal through at least two paths, selects and enables one of the path signals in response to a plurality of path selection signals, and maintains the rest of the path signals in a high impedance state. The multi-path input buffer circuit also includes a level shifter, which shifts the voltage level of a signal output from the input buffer stage via the first path, and a first logic operation circuit, which operates in response to the output signal of the input buffer stage and a signal output from the level shifter.

The input buffer stage can include a first path which selects one of a signal obtained by buffering the input signal and a high impedance signal using the first power supply voltage in response to a first path selection signal and outputs the selected signal as a first path signal. The input buffer stage also includes a second path, which selects one of a signal obtained by buffering the input signal, and a high impedance signal using the second power supply voltage in response to a second path selection signal and outputs the selected signal as a second path signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
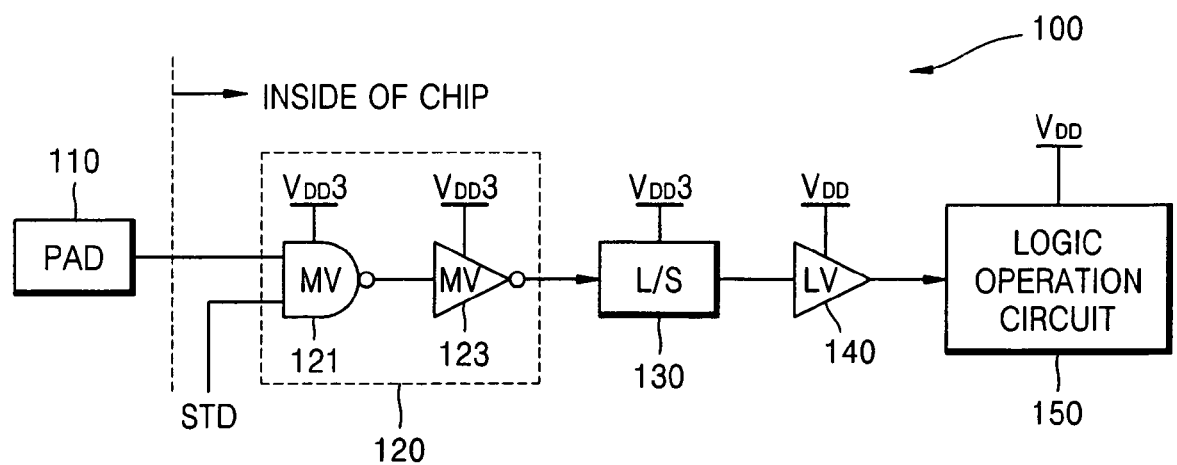
FIG. 1 is a circuit diagram of a conventional input buffer circuit.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 2:
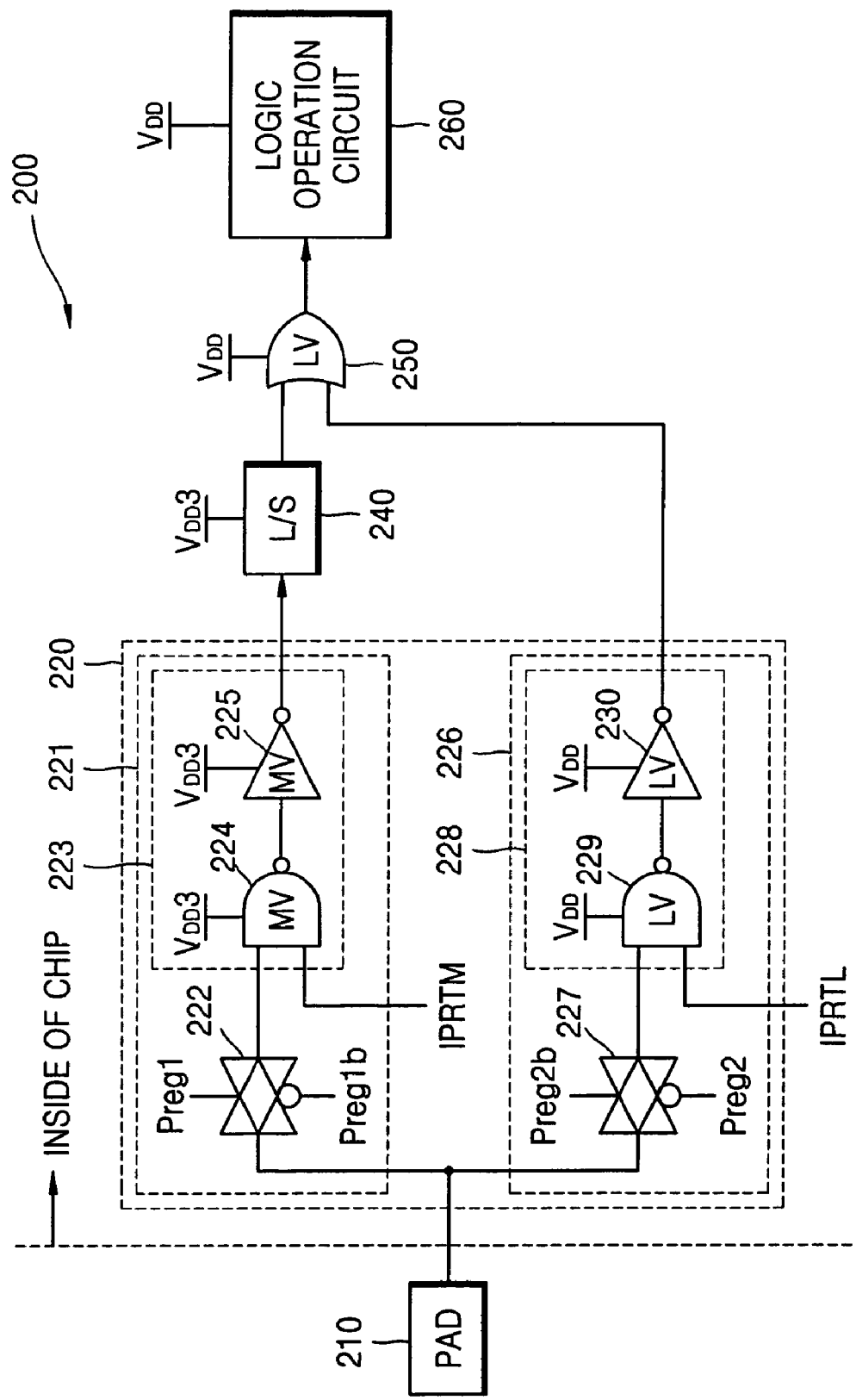
FIG. 2 is a circuit diagram of a multi-path input buffer circuit according to an embodiment of the present invention.

FIG. 2 is a circuit diagram of a multi-path input buffer circuit 200 according to an exemplary embodiment of the present invention. Referring to FIG. 2, the multi-path input buffer circuit 200 includes an input buffer stage 220, a level shifter 240, and a first logic operation circuit 250. The input buffer stage 220 includes a first path 221, which is set for processing signals having a large swing width, and a second path 226, which is set for signals having a small swing width. The first path 221 includes a first switch 222 and a first buffering block 223. The first buffering block 223 includes a NAND gate 224 and an inverter 225. The second path 226 includes a second switch 227 and a second buffering block 228. The second buffering block 228 includes a NAND gate 229 and an inverter 230.

The level shifter 240 lowers the voltage level of a signal output from the first path 221 and is driven at a first power supply voltage VDD3, which is a relatively high voltage. The first logic operation circuit 250 performs a logic operation on a signal output from the level shifter 240 and a signal output from the second path 226 and is driven at a second power supply voltage VDD, which is a relatively low voltage. Preferably, but not necessarily, the first logic operation circuit 250 is a NOR gate.

An input signal is applied to a semiconductor device via a pad 210. An input signal applied to the semiconductor device may be transmitted via one of the first and second paths 221 and 226 depending on which one of switches 222 and 227 is turned on. Here, the switch 222 is connected to one end of the first path 221, and the switch 227 is connected to one end of the second path 226. A user determines a voltage level at which the semiconductor device is to be driven. Once the voltage level at which the semiconductor device is to be driven is determined, the user may forcefully input path selection signals Preg1, Preg1b, Preg2, and Preg2b for controlling the switches 222 and 227 to the semiconductor device or may generate the path selection signals Preg1, Preg1b, Preg2, and Preg2b in the semiconductor device under predetermined conditions. The phase of the path selection signal Preg1 is opposite to the phase of the path selection signal Preg1b, and the phase of the path selection signal Preg2 is opposite to the phase of the path selection signal Preg2b. In addition, the phase of the path selection signal Preg1 is opposite to the phase of the path selection signal Preg2, and the path selection signals Preg1 and Preg2 may have different voltage levels.

The first path 221 is designed to deal with signals having a high voltage level. Accordingly, if the first path 221 is selected by the path selection signals Preg1 and Preg1b because the input signal has a high voltage level, the input signal is transmitted only through the first path 221. However, if the input signal has a low voltage level, it is transmitted only through the second path 226 selected by the path selection signals Preg2 and Preg2b. Each of the first and second paths 221 and 226 falls into a high impedance state or outputs a uniform level of DC voltage when not selected.

The driving capability of the input signal is improved by the buffering block 223 or 228. The phase of the input signal may change when passing the input signal through the buffering block 223 or 228. The phase of the input signal can be easily prevented from changing by adjusting the number of logic gates that invert the phase of the input signal. In the present embodiment, the multi-path input buffer circuit 200 has a simple structure including the NAND gates 224 and 229 and the inverters 225 and 230. The buffering blocks 223 and 228 not only perform a buffering operation but also reduce the power consumption of the semiconductor device in a low power mode using, for example, the NAND gates 224 and 229. In other words, the buffering blocks 223 and 228 stop stages subsequent to the input buffer stage 220 from operating by fixing signals output from the input buffer stage 220 at a uniform level of DC voltage in response to low power mode signals IPRRM and IPRRL.

The first power supply voltage VDD3 supplied to the first buffering block 223 is higher than the second power supply voltage VDD supplied to the second buffering block 228. The second power supply voltage VDD is generated by a voltage regulator installed in the semiconductor device with the use of the first power supply voltage VDD3 or may be input to the semiconductor device from the outside of the semiconductor device.

Figure 3:
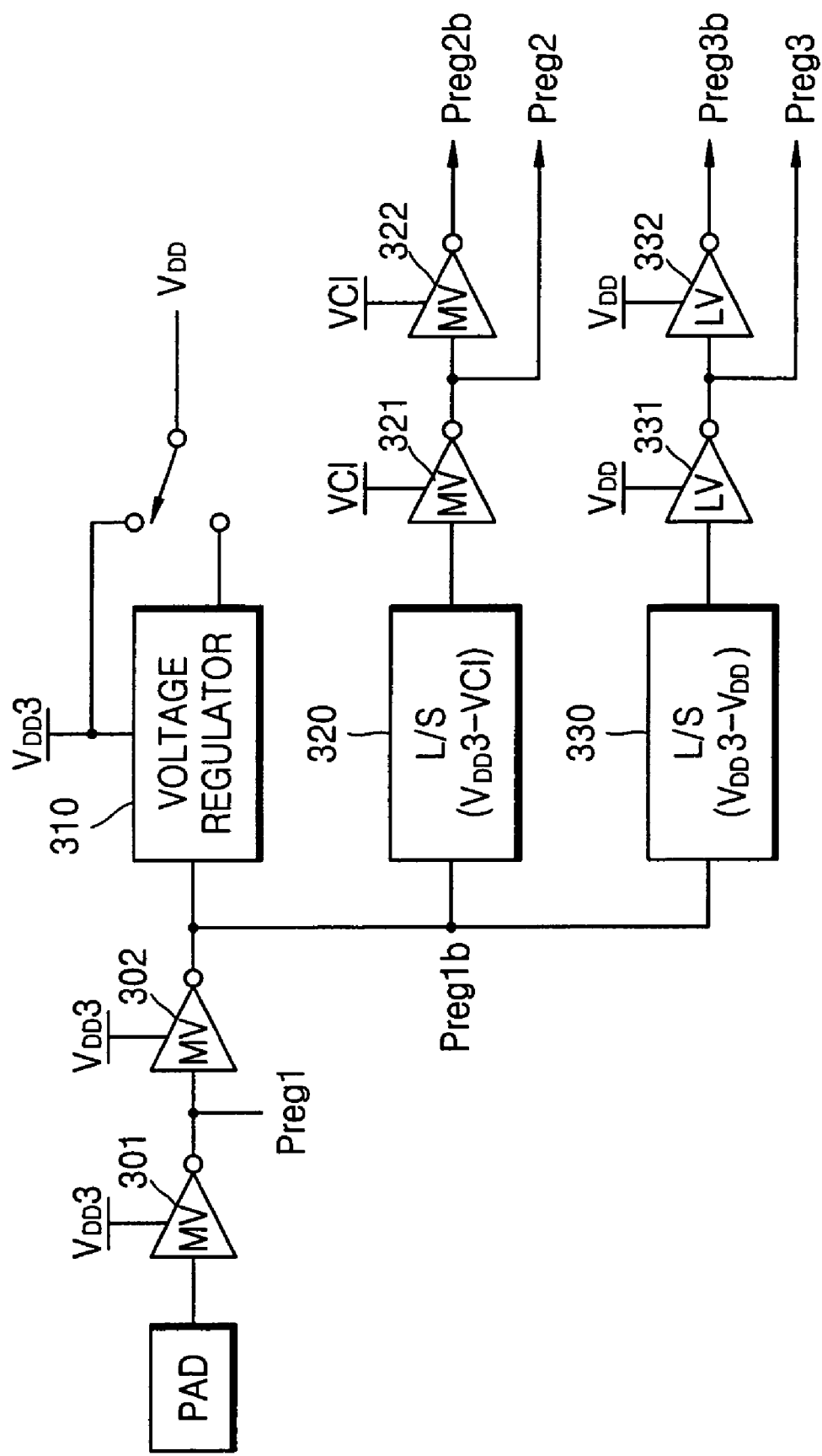
FIG. 3 is a circuit diagram of a device for generating signals and power supply voltages used in the multi-path input buffer circuit of FIG. 2.

FIG. 3 is a circuit diagram of a device for generating signals and power supply voltages used in the multi-path input buffer circuit 200 of FIG. 2. Referring to FIG. 3, either the first power supply voltage VDD3 or a voltage output from the voltage regulator 310 may be selected as the second power supply voltage VDD. Therefore, the logic operation circuit 260 of the semiconductor device may be driven not only at a high power supply voltage level but also at a low power supply voltage level.

The path selection signals Preg1 and Preg1b are generated based on a control signal (not shown) input from the outside of the semiconductor device via a pad PAD. Specifically, the path selection signal Preg1 is generated by passing the control signal through an inverter 301, and the path selection signal Preg1b is generated by passing the path selection signal Preg1 through an inverter 302. The path selection signals Preg1 and Preg1b may be generated using a signal indicating that the operation of the voltage regulator 310 is initiated, instead of using the control signal input from the outside of the semiconductor device.

The path selection signal Preg2 is generated by passing the path selection signal Preg1b through a level shifter 320 and then an inverter 321, and the path selection signal Preg2b is generated by applying the path selection signal Preg2 to an inverter 322. The level shifter 320 may be driven using the first power supply voltage VDD3 or a third power supply voltage VCI, which is equal to or higher than the first power supply voltage VDD3. The third power supply voltage VCI may be a power supply voltage supplied to an analog circuit block of the semiconductor device. Here, the voltage levels of the path selection signals Preg2 and Preg2b are set high in order to prevent the voltage level of a signal input to the multi-path input buffer circuit 200 from being reduced at the switch 227. A path selection signal Preg3 is used for generating a low power mode signal. The path selection signal Preg3 is generated by passing the path selection signal Preg1b through a level shifter 330 and then an inverter 331. A path selection signal Preg3b is generated by passing the path selection signal Preg3 through an inverter 332.

Figure 4:
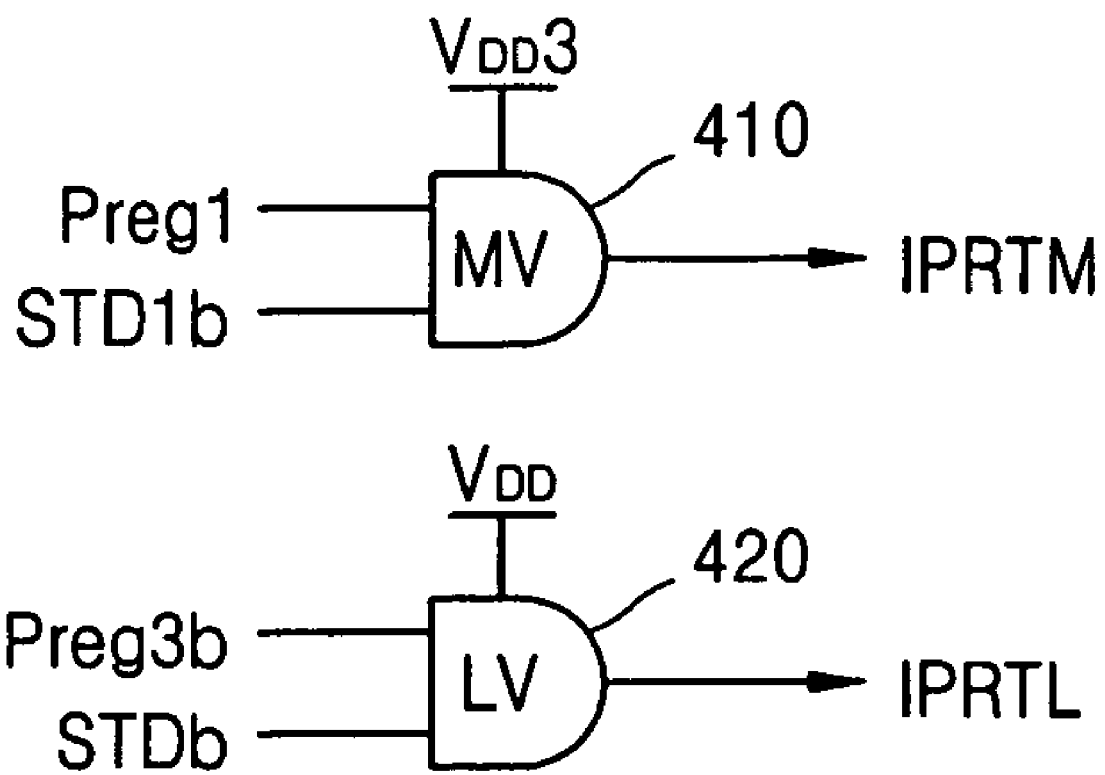
FIG. 4 is a circuit diagram of a device for generating low power mode signals.

FIG. 4 is a circuit diagram of a device for generating low power mode signals. Referring to FIG. 4, a first low power mode IPRTM, which is used in the first path 221 of FIG. 1, is generated by a NAND gate 410, which is driven by the first power supply voltage VDD3, using the path selection signal Preg1 and a low power mode indication signal STD1b input thereto. The NAND gate 410 is driven using the first power supply voltage VDD3. A second low power mode signal IPRTL is generated by a NAND gate 420, which is driven by the second power supply voltage VDD, using the path selection signal Preg3b and a low power mode indication signal STDb.

Accordingly, as described above, a multi-path input buffer circuit 200 according to embodiments of the present invention includes an input buffer stage 220, a voltage level shifter 240 and a logic operation circuit 250. The input buffer stage includes at least first and second input paths 221 and 226. These first and second input paths 221 and 226 are powered at first and second different voltage levels, respectively. The first and second voltage levels are illustrated as VDD3 and VDD. The first and second input paths 221 and 226 are also responsive to first and second path selection signals, respectively, which are shown as Preg1 and Preg2. The first input path 221 includes a first switch 222 (e.g., CMOS transmission gate) and a first buffering circuit 223, which is responsive to a first mode signal IPRTM. The second input path 226 includes a second switch 227 (e.g., CMOS transmission gate) and a second buffering circuit 228, which is responsive to a second mode signal IPRTL. According to preferred aspects of these embodiments, a high-to-low voltage swing (i.e., 1-to-0 voltage swing) of the second path selection signal Preg2 is greater than a high-to-low voltage swing of the first path selection signal Preg1 in order to prevent any significant voltage drop across the second switch. A path selection signal generating circuit (see, e.g., FIG. 3) is also provided. This path selection signal generating circuit is configured to generate the second path selection signal Preg2 in response to the first path selection signal Preg1.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A multi-path input buffer circuit, comprising:
an input buffer stage having at least first and second input paths therein powered at first and second different voltage levels, respectively, and responsive to first and second path selection signals, respectively;
a voltage level shifter having an input electrically coupled to an output of the first input path; and
a first logic operation circuit having a first input electrically coupled to an output of said voltage level shifter and a second input electrically coupled to an output of the second input path;
wherein the first input path comprises a first switch and a first buffering circuit that is powered at the first voltage level and has an input electrically coupled to an output of the first switch; and
wherein the first buffering circuit is responsive to a first mode signal having a first logic state that enables the first buffering circuit and a second logic state that disables the first buffering circuit.

2. A multi-path input buffer circuit, comprising:
an input buffer stage having at least first and second input paths therein powered at first and second different voltage levels, respectively, and responsive to first and second path selection signals, respectively;
a path selection signal generating circuit configured to generate the second path selection signal in response to the first path selection signal;
a voltage level shifter having an input electrically coupled to an output of the first input path; and
a first logic operation circuit having a first input electrically coupled to an output of said voltage level shifter and a second input electrically coupled to an output of the second input path;
wherein the second path selection signal is generated by shifting the voltage level of the first path selection signal.

3. The buffer circuit of claim 1, wherein said first logic operation circuit is configured to perform a logical OR operation.

4. A multi-path input buffer circuit, comprising:
an input buffer stage having at least first and second input paths therein powered at first and second different voltage levels, respectively, and responsive to first and second path selection signals, respectively;
a voltage level shifter having an input electrically coupled to an output of the first input path; and
a first logic operation circuit having a first input electrically coupled to an output of said voltage level shifter and a second input electrically coupled to an output of the second input path;
wherein the first input path comprises a first switch and a first buffering circuit that is powered at the first voltage level and has an input electrically coupled to an output of the first switch; and
wherein the first switch is a first CMOS transmission gate having an input terminal electrically coupled to an input of said input buffer stage.

5. The buffer circuit of claim 4, wherein the second input path comprises a second CMOS transmission gate and a second buffering circuit that is powered at the second voltage level and has an input electrically coupled to an output of the second CMOS transmission gate.

6. The buffer circuit of claim 5, wherein the first and second CMOS transmission gates are responsive to the first and second path selection signals, respectively.

7. A multi-path input buffer circuit which is used in hardware designed to be able to selectively use one of at least two power supply voltages, converts an input signal to be compatible with one of the power supply voltages selected by a user, and outputs the converted input signal, the multi-path input buffer circuit comprising:
an input buffer stage which can be driven using one of at least two power supply voltages, outputs path signals by passing an input signal through at least two paths, selects and enables one of the path signals in response to a plurality of path selection signals, and maintains the rest of the path signals in a high impedance state;
a level shifter which shifts the voltage level of a signal output from the input buffer stage via the first path; and
a first logic operation circuit, which operates in response to the output signal of the input buffer stage and a signal output from the level shifter;
wherein the input buffer stage comprises:
a first path which selects one of a signal obtained by buffering the input signal and a high impedance signal using the first power supply voltage in response to a first path selection signal and outputs the selected signal as a first path signal; and a second path which selects one of a signal obtained by buffering the input signal and a high impedance signal using the second power supply voltage in response to a second path selection signal and outputs the selected signal as a second path signal.

8. The multi-path input buffer circuit of claim 7, wherein the first path comprises:
a first switch that switches the input signal in response to the first path selection signal; and
a first buffering block that buffers a signal output from the first switch, and outputs the buffered signal as the first path signal, and
the second path comprises:
a second switch that switches the input signal in response to the second path selection signal; and
a second buffering block, that buffers a signal output from the second switch, and outputs the buffered signal as the second path signal.

9. The multi-path input buffer circuit of claim 8, wherein the first and second switches are mutually exclusive.

10. The multi-path input buffer circuit of claim 8, wherein the first path signal is the buffered signal when selected in response to the first path selection signal and is a high impedance signal when not selected, and the second path signal is the buffered signal when selected in response to the second path selection signal and is a high impedance signal when not selected.

11. The multi-path input buffer circuit of claim 10, wherein, among the power supply voltages, the first power supply voltage is highest, and the second power supply voltage is lower than the first power supply voltage.

12. The multi-path input buffer circuit of claim 11, wherein a signal buffered through the first path swings between the first power supply voltage and a reference voltage, a signal buffered through the second path swings between the second power supply voltage and the reference voltage, and the reference voltage is equal to or lower than a ground voltage.

13. The multi-path input buffer circuit of claim 10, wherein one of the first and second path selection signals is determined depending on which one of the power supply voltages the user decides to use.

* * * * *